United States Patent

Hueber et al.

Patent Number: 5,153,597
Date of Patent: Oct. 6, 1992

[54] ACOUSTO-OPTICAL CLASSIFIER

[76] Inventors: Werner G. Hueber, 603 Ticonderoga, China Lake; James L. Jernigan, 408 S. Broadway, Inyokern, both of Calif. 93555

[21] Appl. No.: 752,713

[22] Filed: Dec. 13, 1976

[51] Int. Cl.[5] .............................................. G01S 7/295
[52] U.S. Cl. ...................................... 342/192; 342/196; 359/287; 359/306
[58] Field of Search ................ 343/5 SA; 350/161 W; 342/192, 196; 359/287, 306

[56] References Cited

U.S. PATENT DOCUMENTS

| | | | |
|---|---|---|---|
| 3,483,387 | 12/1969 | Davis, Jr. .................. | 350/161 W X |
| 3,900,851 | 8/1975 | Bucy et al. ................. | 350/161 W X |
| 4,012,120 | 3/1977 | Kagiwada et al. ............ | 350/161 W |
| 4,016,563 | 4/1977 | Pedinoff ..................... | 343/5 SA |
| 4,087,815 | 5/1978 | Garrison et al. ............. | 342/192 X |

*Primary Examiner*—T. H. Tubbesing
*Attorney, Agent, or Firm*—Melvin J. Sliwka; John L. Forrest, Jr.

[57] ABSTRACT

An acousto-optical classifier for classifying wide bandwidth signals such as high resolution radar returns of ships or very short pulse length signals of radar emitters. This is accomplished by generating the Fourier transform power spectrum with an acousto-optic cell oriented in the Bragg configuration and a low power coherent light source such as a laser. The power spectrum is detected to provide inputs to a digital classifier.

6 Claims, 1 Drawing Sheet

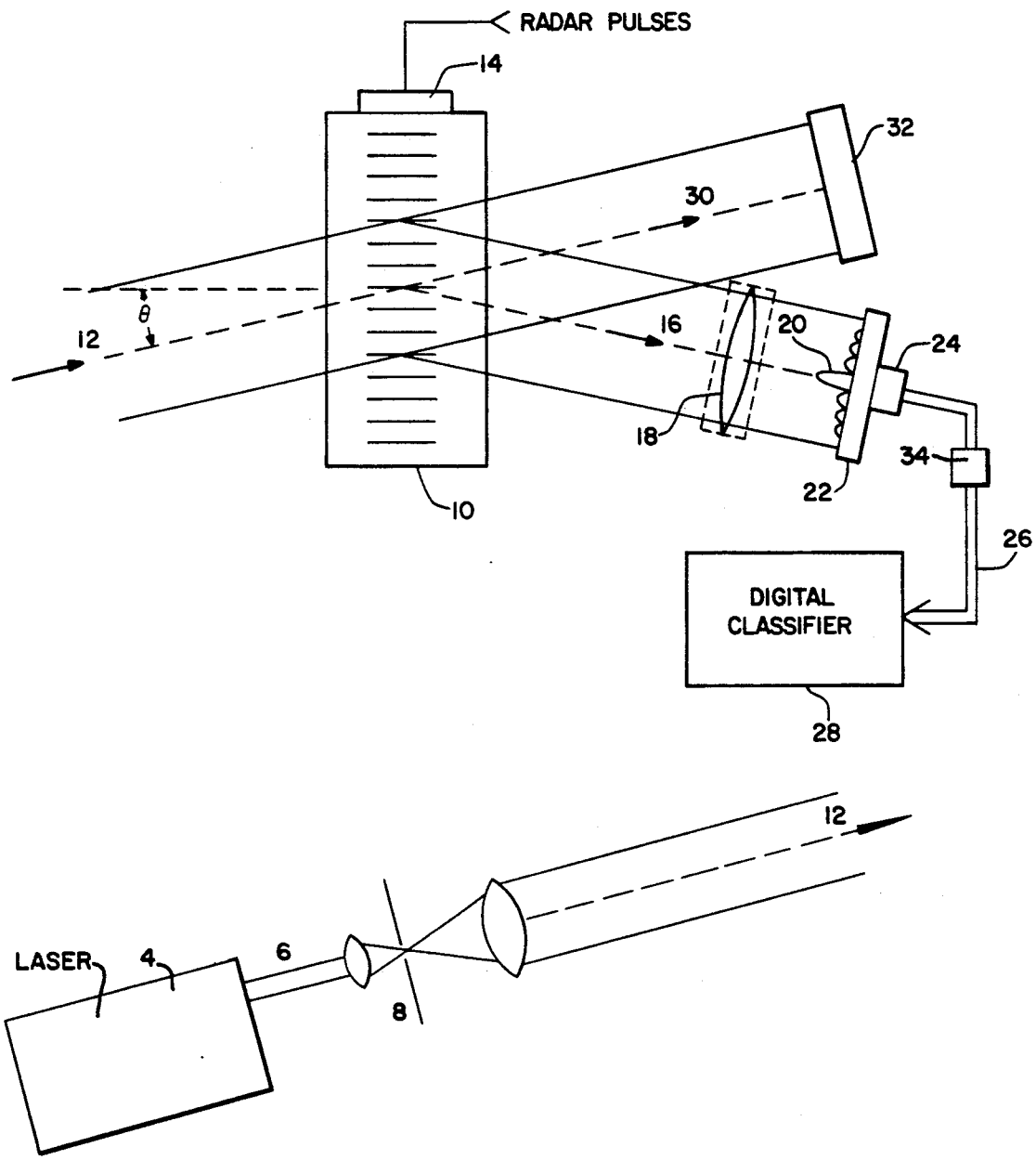

ACOUSTO-OPTICAL CLASSIFIER

BACKGROUND OF THE INVENTION

The present invention relates to high speed classification systems, and more particularly to an acousto-optical processor for providing a Fourier transform power spectrum which is detected in a detector array, digitized and classified in a digital classifier.

Presently, the Fourier transform is one of the most powerful transforms which can be used as the input to classifiers for the classification of signals. Computer processing compatibility requires the signal to be in digital form. Present systems first digitize the radar signal, then perform the digital Fourier transform, extract the appropriate coefficients and perform the classification. Analog to digital converters are required which are bandwidth limited such that wide bandwidth radar signals can only be processed with difficulty. Such converters are costly, complex and large in size.

SUMMARY OF THE INVENTION

Accordingly, the present invention provides a method for overcoming the bandwidth limitation of the present systems through the use of an acousto-optic cell oriented at the Bragg angle to a collimated laser beam. Wide bandwidth radar pulses are converted to acoustic pressure waves by an input piezo-electric transducer which is mechanically coupled to the acousto-optic cell. Pressure waves are generated in the cell which interact with the laser beam to produce optical diffraction patterns that are proportional to the power spectrum of the input radar pulses. The patterns are detected by a photodiode array, digitized and fed to a digital classifier for real time classification.

BRIEF DESCRIPTION OF THE DRAWING

The Figure is a block diagram of an acousto-optical classifier.

DESCRIPTION OF THE PREFERRED EMBODIMENT

Referring now to the Figure, a collimated laser beam 12, pulsed or continuous, is aligned with an acousto-optic cell 10 at the Bragg angle, $\theta$. With the pulsed or continuous beam an accurate time synchronisation between incoming radar signal and readout can be achieved. A radar pulse to be classified forms the input through a transducer 14 to the acousto-optic cell 10 where it appears as an acoustic pressure wave. As the acoustic pressure wave propagates through the acousto-optic cell 10, it produces changes in the index of refraction, making the cell appear as a phase grating to the laser beam 12. Brillouin scattering occurs by the interaction of the laser beam 12 with the acoustic pressure wave, and since the acousto-optic cell 10 is oriented at the Bragg angle, the scattered light is deflected at the Bragg angle to form a diffracted beam 16.

The loser part of the Figure shows a laser 4 emitting a collimated beam 6 which passes through expanding optics 8 and becomes laser beam 12. Any expanded laser beam output system can be used. One possible system is U.S. Pat. No. 3,609,590.

The diffracted beam 16 carries a spatial intensity modulation proportional to the temporal modulation of the acoustic pressure wave, and hence, the radar pulse to classified. Since the far-field diffraction pattern of a collimated coherent light beam is proportional to the spatial Fourier power spectrum of the spatial intensity variations in the light beam, Fourier transform optics 18 are used to produce the far-field diffraction pattern for the steered beam 16 in the form of a continuous light pattern whose intensity is proportional to the power spectrum of the radar pulse. This light intensity pattern 20 is sensed by a photodetector array 22 and stored as an analog pattern of voltages.

A digitizer 24 converts the analog voltage pattern to a digital pattern which is fed via coupling means 26 to a digital classifier 28. The digital classifier 28 can immediately use the Fourier power spectrum transform to classify the radar pulse. "Introduction to Mathematical Techniques in Pattern Recognition", by H. C. Andrews, Wiley-Interscience, 1972, describes classification techniques.

The undiffracted beam 30 is absorbed by a light trap 32 to avoid interference by backscattering with the diffrated beam 16.

Also, optical scattering, or noise, due to imperfections of the optical system, can be subtracted by digital techniques following the photodetector array 22 before the classification is performed. With this subtraction, the signal to noise ratio of the signals for classification can be significatly improved. Since classification can be achieved with only a small number of features or Fourier coefficients, only an array of a few detectors are required for the photodetector array 20.

Subtractor 34 contains a memory that records the signal present when the laser is off. This is background light that includes scatter from cell 10, lens 18, other optical components and dust particles present in the system. Over short periods of time this background light is invariant. A background reading should usually be good for at least one day. Once this background signal is stored in memory it is subracted in the conventional electronic fashion from the signal present when the laser is on. Thus, subtractor 34 provides a means for digitally subtracting the effects of undesirable optical scattering.

The present invention provides a real time Fourier transform process with an overall processing time considerably faster than that realizeable by discrete Fourier transform implementation in digital computers and able to process signals with a very wide bandwidth.

What is claimed is:

1. An acousto-optical classifier comprising:
   a source of optical energy in the form of a collimated beam;
   an acousto-optic cell situated in the path of said beam at the Bragg angle and having an input transducer coupled thereto;
   a radar signal to be classified inputted through said input transducer to said acousto-optic cell to produce an acoustic pressure wave;
   Fourier transform optics positioned in the path of said beam deflected by said acoustic pressure wave for producing a far field diffraction pattern of said deflected beam;
   detecting means for detecting that portion of said beam deflected by said acoustic pressure wave and has passed through said Fourier transform optics; and
   means for digitally converting and classifying the output of said detecting means.

2. An acoustic-optic classifier as recited in claim 1 wherein;

said digitally converting and classifying means comprise;

a digitizer to convert analog information to digital information; and a digital classifier which processes said digital information.

3. An acousto-optical classifier as recited in claim 2 and further comprising;

means for digitally subtracting the effects of undesirable optical scattering; and said digitally subtracting means being situated between said detecting means and said digital classifier.

4. An acousto-optical classifier as recited in claim 3 wherein;

said detecting means comprises a photodetector array.

5. An acousto-optical classifier as recited in claim 4 wherein;

said photodetector array comprises a plurality of photodiodes.

6. An acousto-optical classifier as recited in claim 5 wherein;

said source of optical energy comprises a laser having collimating optics to form said beam.

* * * * *